United States Patent
Adachi et al.

(10) Patent No.: US 6,708,319 B2
(45) Date of Patent: Mar. 16, 2004

(54) MANUFACTURING METHOD OF SEMICONDUCTOR INTEGRATED CIRCUIT DEVICE

(75) Inventors: Hiroyuki Adachi, Koganei (JP); Masayuki Sato, Takasaki (JP)

(73) Assignee: Renasas Technology Corporation, Tokyo (JP)

( * ) Notice: Subject to any disclaimer, the term of this patent is extended or adjusted under 35 U.S.C. 154(b) by 86 days.

(21) Appl. No.: 10/006,243

(22) Filed: Dec. 10, 2001

(65) Prior Publication Data

US 2002/0072135 A1 Jun. 13, 2002

(30) Foreign Application Priority Data

Dec. 12, 2000 (JP) ........................................ 2000-376910

(51) Int. Cl.⁷ .......................... G06F 17/50; G06F 19/00
(52) U.S. Cl. .............................. 716/5; 716/18; 716/12; 700/110; 700/121; 714/30; 702/118; 703/16
(58) Field of Search ................................. 716/5, 18, 12; 700/110, 121; 714/30; 702/118; 703/16

(56) References Cited

U.S. PATENT DOCUMENTS

| | | | | |
|---|---|---|---|---|
| 4,191,996 A | * | 3/1980 | Chesley | 714/30 |
| 5,068,823 A | * | 11/1991 | Robinson | 716/16 |
| 5,274,575 A | * | 12/1993 | Abe | 356/400 |
| 5,594,273 A | * | 1/1997 | Dasse et al. | 257/620 |
| 5,617,531 A | * | 4/1997 | Crouch et al. | 714/30 |
| 5,633,812 A | * | 5/1997 | Allen et al. | 703/15 |
| 5,663,656 A | * | 9/1997 | Wilson et al. | 324/763 |
| 5,742,616 A | * | 4/1998 | Torreiter et al. | 714/732 |
| 5,748,644 A | * | 5/1998 | Szabo | 714/733 |

(List continued on next page.)

FOREIGN PATENT DOCUMENTS

WO   WO00/62339   10/2000   ........... H01L/21/82

OTHER PUBLICATIONS

NB9109202, "Machine on a Wafer", IBM Technical Disclosure Bulletin, vol. 34, No. 4B, Sep. 1991, pp. 202–203 (4 pages).*

Jain et al., "Defect tolerance and yield for a wafer scale FFT processor system", Proceedings of 3rd International Conference on Wafer scale Integration, Jan. 29, 1991, pp. 54–60.*

Chang et al., "Loop–based design and reconfiguration of wafer–scale linear arrays with high harvest rates", IEEE Journal of Solid–State Circuits, vol. 26, No. 5, May 1991, pp. 717–726.*

Primary Examiner—Vuthe Siek
Assistant Examiner—Phallaka Kik
(74) Attorney, Agent, or Firm—Mattingly, Stanger & Malur, P.C.

(57) ABSTRACT

A manufacturing method of a semiconductor integrated circuit device includes the steps of: providing wiring conductors capable of connecting between chips or devices and variable switching devices capable of connecting between predetermined wiring conductors on a wafer formed of a microcomputer built-in chip having a CPU and a writable memory circuit for storing an operation program or on a testing board provided with a microcomputer built-in device enclosed by a package; writing a testing program including the transmission and reception operation of signals between the devices or chips into the memory circuit re-writable and capable of using as a program storing area for one of the chips or devices; and executing the testing program in the CPU of the chip or device, thereby testing a testing chip, between the device and the testing chip or an input/output circuit of the device.

15 Claims, 8 Drawing Sheets

U.S. PATENT DOCUMENTS

| | | | | |
|---|---|---|---|---|
| 6,003,150 | A | * 12/1999 | Stroud et al. | 714/725 |
| 6,061,811 | A | * 5/2000 | Bondi et al. | 714/30 |
| 6,065,142 | A | * 5/2000 | Ban | 714/718 |
| 6,070,252 | A | * 5/2000 | Xu et al. | 714/30 |
| 6,108,806 | A | * 8/2000 | Abramovici et al. | 714/725 |
| 6,351,789 | B1 | * 2/2002 | Green | 711/128 |
| 6,363,329 | B2 | * 3/2002 | Beffa | 702/118 |
| 6,456,961 | B1 | * 9/2002 | Patil et al. | 703/14 |
| 6,553,329 | B2 | * 4/2003 | Balachandran | 702/118 |
| 2002/0010560 | A1 | * 1/2002 | Balachandran | 702/118 |
| 2002/0059054 | A1 | * 5/2002 | Bade et al. | 703/20 |
| 2002/0059543 | A1 | * 5/2002 | Cheng et al. | 714/30 |
| 2002/0073380 | A1 | * 6/2002 | Cooke et al. | 716/1 |
| 2003/0115564 | A1 | * 6/2003 | Chang et al. | 716/8 |
| 2003/0131325 | A1 | * 7/2003 | Schubert et al. | 716/4 |

* cited by examiner

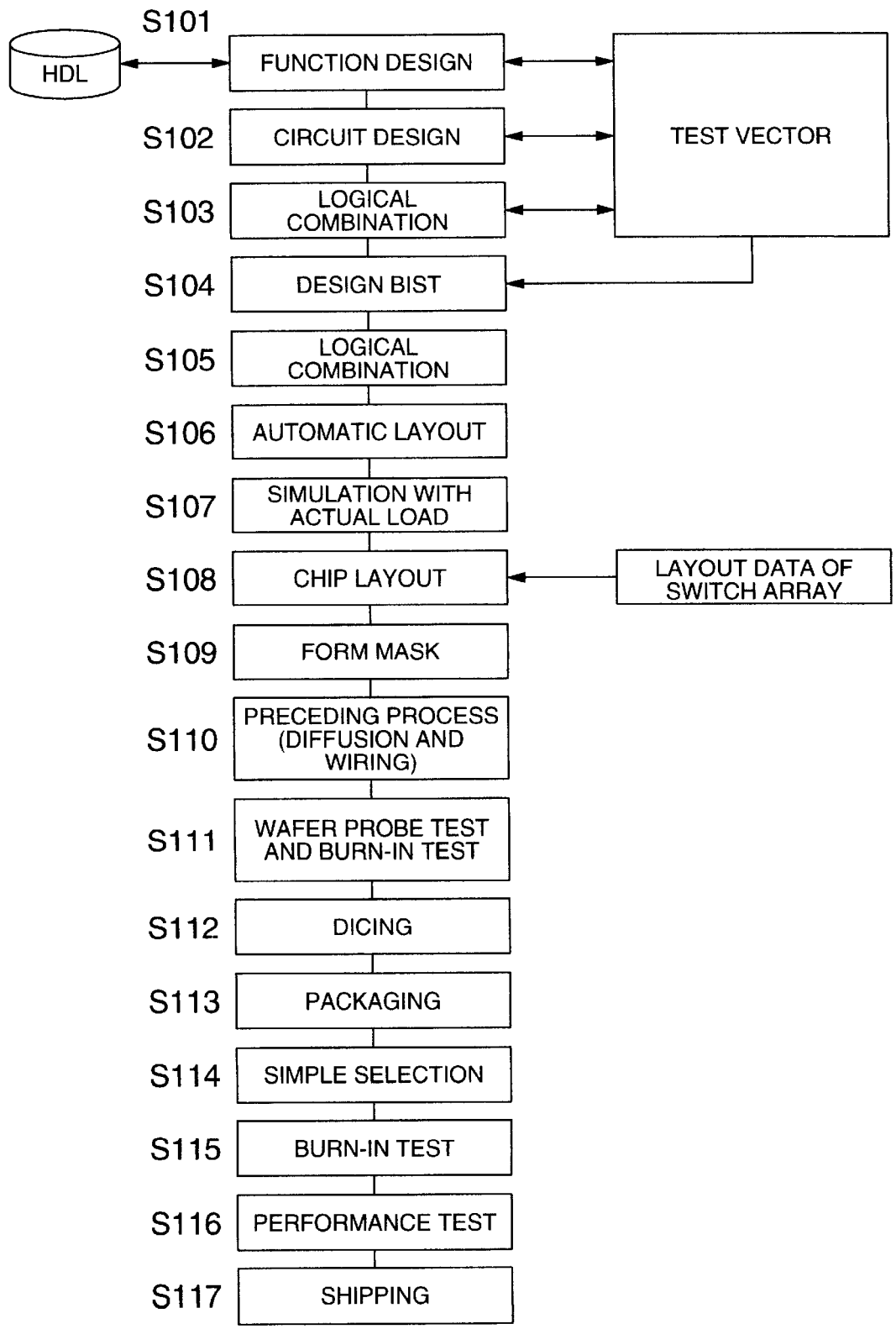

MANUFACTURING METHOD OF SEMICONDUCTOR INTEGRATED CIRCUIT DEVICE

BACKGROUND OF THE INVENTION

1. Field of the Invention

The present invention relates to a semiconductor integrated circuit device and a manufacturing method thereof and more particularly to a test facilitating design method capable of reducing the overhead by mounting a testing circuit in the semiconductor integrated circuit device. The present invention also relates to a technique effective for application to, for example, a microprocessor and a one-chip microcomputer including a CPU (Central Processing Unit) and a writable memory circuit in which an operation program for the CPU is stored.

2. Description of the Related Art

Generally, in a case of a test facilitating design method in a logic LSI named a system LSI having a CPU, a RAM (Random Access Memory) and the like mounted or integrated therein, a scan path method is commonly used for testing logical states of an internal logic circuit, with it operated, constituting flip-flop circuits connected in series by supplying test data to the internal logic circuit. The scan path method has about 35% overhead of hardware and a failure detection ratio thereof is only about 85%.

Further, in addition to the scan path method, there is a BIST (Built-In Self-Test) method including a random pattern generator and a signature compressor mounted in a chip as a testing circuit. The BIST method is different from the logical verification using a test pattern generated in accordance with a failure detection algorithm used in the scan path method and uses a random test pattern. Moreover, recently, in a semiconductor memory such as a RAM, there is proposed a technique named a so-called memory BIST in which a predetermined test pattern is generated in accordance with a predetermined algorithm within a chip to detect a defective bit.

However, even when the BIST method is adopted, it is necessary to connect a high-speed and high-function tester thereto as used in the scan path method and perform measurement in accordance with control instructed from the tester. In the test performed by the BIST circuit, since the expensive tester is often waited in mere waiting time processing, the cost required for the test is not reduced.

For this reason, inventors have proposed a technique so-called "logic with test function" for self-testing the logic with a logic tester constituted in a chip, which is a measuring manner with a test circuit built-in chip that is different from BIST. This method can reduce the cost required for the test greatly since it is not necessary to use an expensive tester, although there has a large overhead of hardware and the yield of product is reduced due to failure of a testing circuit itself mounted in a chip similarly to the BIST method.

In order to solve this problem, the inventors have before proposed a technique named a so-called "testing method without overhead" that an FPGA (Field Programmable Gate Array) is provided in a chip to configure an ALPG (Algorithmic Pattern Generator) by the FPGA so that a test pattern is generated in accordance with a predetermined algorithm to perform a test and a usual logic circuit is re-configured in the FPGA after completion of the test (International Publication WO 00/62339).

In this technique, a circuit named a so-called self-verification type FPGA capable of detecting its own defect is provided in a user logic circuit to configure a testing circuit therein to test itself and a user circuit is provided in the FPGA finally to reduce the overhead of hardware caused by the provision of the testing circuit. The method is characterized in that since the FPGA constitutes the self-verification type circuit, a defective portion can be detected by itself to output information concerning the defective portion to the outside so that the circuit can be configured with the exception of the defective portion when a logic tester is configured in the FPGA by means of the tester HDL (Hardware Description Language) or when a user circuit is configured in the FPGA and accordingly reduction of the yield can be avoided.

In the above method, however, it is necessary to introduce a process for a new device named the FPGA and semiconductor makers providing the FPGAs or products having the FPGA mounted therein to the market can realize the user circuit including the FPGA by slight modification of processes, although there is an impediment that general semiconductor makers do not usually manufacture the FGPAs or the products having the FPGA mounted therein and it is necessary to design the FPGA and develop a new process for fabricating the FPGA on a semiconductor chip for the purpose of the development of this method.

Furthermore, even when the aforementioned test facilitating design technique is applied to configure the testing circuit within the chip, only an internal circuit can be tested by the testing circuit and a test as to whether an input/output circuit for outputting a signal to an external terminal and taking in a signal externally is operated normally or not must be performed by means of a tester.

SUMMARY OF THE INVENTION

It is an object of the present invention to provide a test technique of a semiconductor integrated circuit device capable of performing test with high accuracy without using an expensive tester.

It is another object of the present invention to provide a test technique suitable for a semiconductor integrated circuit device such as a microprocessor and a one-chip microcomputer including a CPU and a writable memory circuit for storing an operation program thereof.

The above and other objects and novel features of the present invention will be apparent from the following description and the accompanying drawings of the specification.

Representatives of the inventions disclosed in the present application are summarized as follows.

That is, a manufacturing method of a semiconductor integrated circuit device comprises the steps of providing wiring conductors capable of connecting between any of chips or devices and variable switch circuits capable of connecting between predetermined wiring conductors on a wafer in which microprocessor-included chips or microcomputer-included chips including a CPU and a writable memory circuit for storing an operation program of the CPU are formed or on a testing board in which microprocessor-included devices or microcomputer-included devices packed into packages are mounted, writing a testing program into a writable memory circuit capable of being used as a program storage area in any one of chips or devices, and executing the testing program by the CPU of that any one of chips or devices to thereby test a testing chip or device and a chip or device to be tested.

According to the above configuration of the present invention, since the chip or device on the wafer or board can be used to test another chip or device, the test or part of the test similar to that performed by a conventional tester can be made by means of a burn-in apparatus or an aging apparatus without using an expensive tester to thereby reduce a cost of the test.

The test performed by the testing program is to test transmission and reception operation of signals between any one of chips or devices and another chip or device. Since it is possible to detect that the input/output circuit of any of two chips or devices connected for the purpose of the test on the wafer or board is defective or the input/output circuit of any of chips is normal, the chip or device having the input/output circuit judged as normal can be used as a testing circuit to test remaining chips or devices on the wafer or board, so that judgment as to whether the chips or devices are good or defective can be performed efficiently.

Further, preferably, a self-testing circuit for testing an internal circuit is provided within the microprocessor-built-in chip or microcomputer-built-in chip or device and after the internal circuit is tested by the self-testing circuit, the input/output circuit is tested by means of transmission and reception of signals between the any of chips. Accordingly, the whole of chip or device including the internal circuit can be tested without using an expensive tester to thereby reduce the cost required for the test.

Moreover, preferably, the internal circuit is divided into a plurality of functional blocks and the self-testing circuit is provided in each of the functional blocks. After the functional block has been tested by the self-testing circuit corresponding thereto, the input/output circuit is tested by means of transmission and reception of signals between the any of chips. Although when the scale of logic in the chip or device is increased, a test pattern of the self-testing circuit for testing the chip or device is made complicated and very large and a test time is lengthened, the division of the internal circuit into a plurality of functional blocks and the provision of the self-testing circuit in each of the functional blocks can simplify the test pattern and can operate a plurality of self-testing circuits in parallel to perform the test, so that the test time can be shortened.

Further, the wiring conductors capable of connecting between the any of chips and the variable switch circuits capable of connecting between the predetermined wiring conductors are disposed in a chip dividing area of the wafer. Consequently, the above test can be performed without increase of the overhead of hardware.

Furthermore, the wiring conductors capable of connecting between the any of chips are disposed in the whole area of the wafer and the variable switch circuits capable of connecting between the wiring conductors are disposed in a chip dividing area of the wafer. Thus, even if the number of chips on the wafer is increased, the hardware capable of performing the above test can be provided in the chip dividing area having the substantially same area as the chip dividing area on the conventional wafer.

Moreover, the test of the internal circuit or the functional block by the self-testing circuit and the test of the input/output circuit by means of transmission and reception of signals between any of chips are performed by a burn-in apparatus or an aging apparatus in a state where the chips are mounted on the wafer. Consequently, the burn-in test and the functional test of the chips or devices can be performed at the same time and the test time can be shortened greatly to thereby reduce the cost required for the test.

In addition, the testing program written in the memory circuit within the chip is described in a C-language used in a virtual tester. Consequently, when a microprocessor-built-in device or a microcomputer-built-in device is developed newly, it is not necessary to prepare a dedicated testing program in order to test the input/output circuit by means of transmission and reception of signals between chips or devices, so that a development term of a new product can be shortened.

BRIEF DESCRIPTION OF THE DRAWINGS

FIG. 8 is a flow chart showing a procedure of a manufacturing method of a microcomputer-built-in device to which the present invention is applied.

DETAILED DESCRIPTION OF THE EMBODIMENTS

Preferred embodiments of the present invention are now described with reference to the accompanying drawings.

Figure 1:
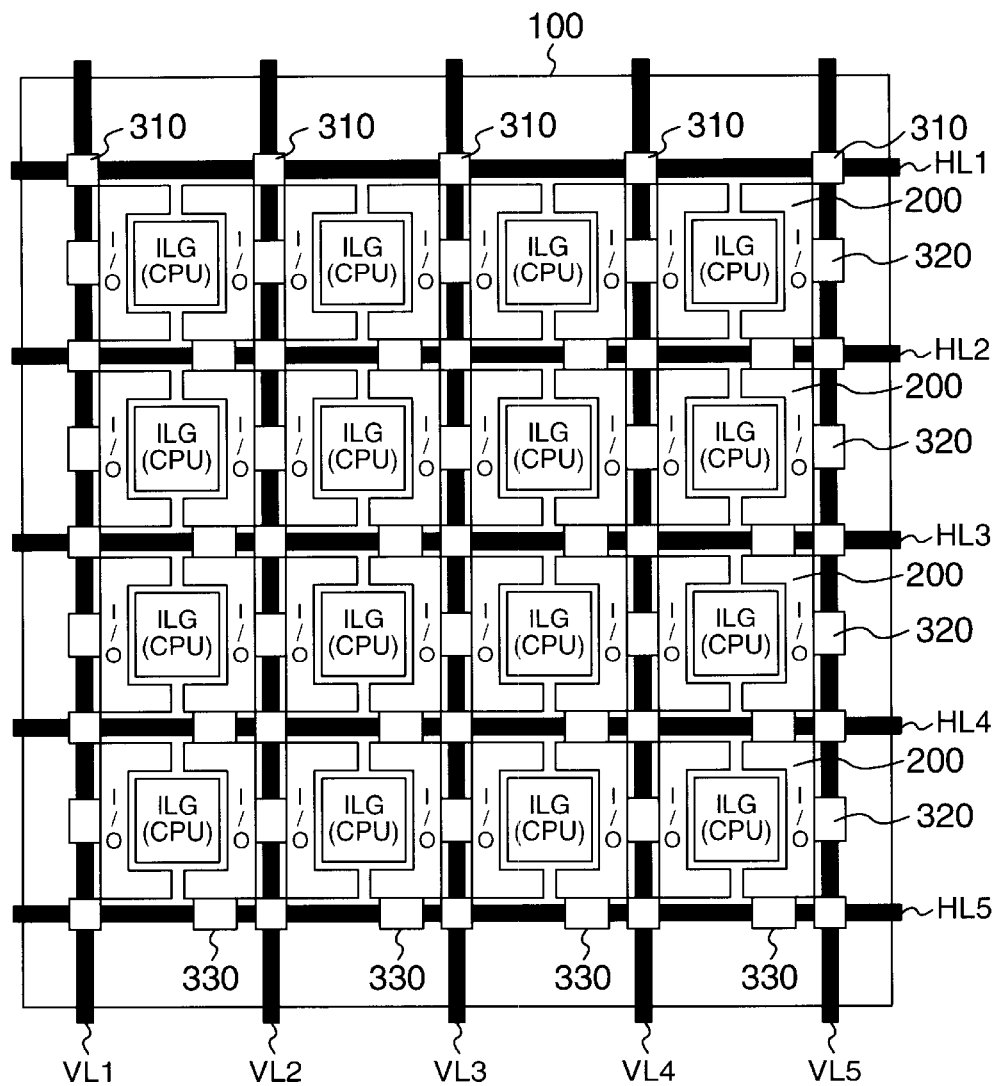
FIG. 1 is a block diagram schematically illustrating an embodiment of a wafer level to which a test facilitating design technique according to the present invention is applied.

Referring to FIG. 1 illustrating in a block diagram an embodiment of a wafer level to which a test facilitating design technique according to the present invention is applied, circuit blocks are formed on a single semiconductor wafer 100 made of monocrystalline silicon by means of a known manufacturing technique of semiconductor integrated circuits.

In FIG. 1, numeral 200 denotes a chip (hereinafter referred to as a microcomputer-built-in chip) in which a microprocessor or a microcomputer (hereinafter referred to as a CPU) is mounted or integrated. Each microcomputer-built-in chip 200 is composed of an internal circuit ILG (Inner Logic Gate) including a CPU and input/output circuits I/O of signals.

In the embodiment, wiring groups VL1 to VL5 and HL1 to HL5 are formed in vertical and horizontal directions in a chip dividing area for cutting each chip, respectively, so as to form a lattice. The chip dividing area may also restate a scribe area, a chip breaking area or a dicing area. Switch array circuits 310 are disposed at respective intersecting portions of the vertical wiring groups VL1 to VL5 and the horizontal wiring groups HL1 to HL5 so that signal lines intersecting each other can be connected selectively. Further, switch arrays 320 are disposed to connect the vertical wiring groups VL1 to VL5 to any input/output terminals of the microcomputer-built-in chips 200 and switch arrays 330 are disposed to connect the horizontal wiring groups HL1 to HL5 to any input/output terminals of the microcomputer-built-in chips 200.

As described above, the vertical wiring groups VL1 to VL5 and the horizontal wiring groups HL1 to HL5 formed in the chip dividing area are structured to be able to connect each other by means of the switch arrays 310 disposed in the intersecting portions thereof, so that any chips on the wafer 100 can be connected to one another. The switch arrays 310, 320 and 330 are structured as illustrated in FIG. 2.

Figure 2A:
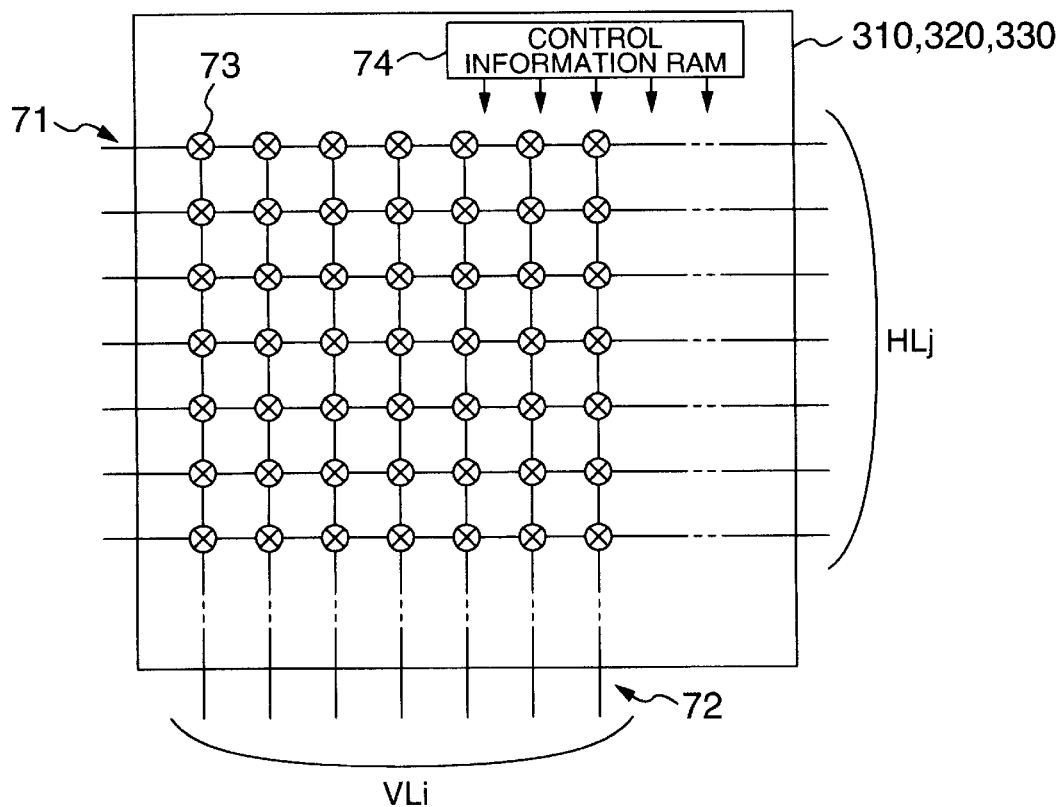
FIGS. 2A, 2B and 2C schematically illustrate a definite example of a switch array provided in a chip dividing area of the embodiment of FIG. 1.

More particularly, as shown in FIG. 2A, the switch arrays 310, 320 and 330 have transfer-switch circuits 73 disposed in intersecting points of a plurality of signal lines 71 constituting the vertical wiring groups VLi and a plurality of signal lines 72 constituting the horizontal wiring groups HLj. The switch arrays 310, 320 and 330 further include a RAM 74 for storing control information for the transfer-switch circuits 73.

Figure 2B:
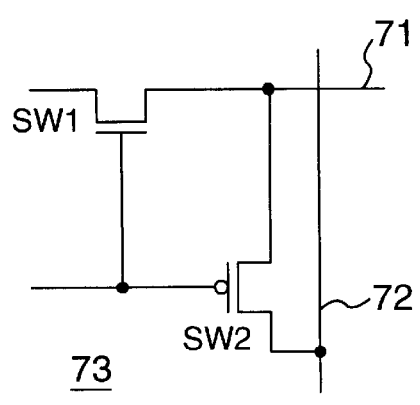

The transfer-switch circuit 73 has, as shown in FIG. 2B, switching elements SW1 and SW2 formed of a pair of MOSFETs which are connected between the signal lines 71 and 72 and turned on and off complementarily. Gate terminals of the switching elements SW1 and SW2 are structured to be controlled in accordance with control information stored in the RAM 74. Thus, for example, when the switching element SW1 is turned on and the switching element SW2 is turned off, the signal lines 71 and 72 are electrically cut off so that the signal line 71 transmits a signal in the horizontal direction and the signal line 72 transmits a signal in the vertical direction.

Figure 2C:
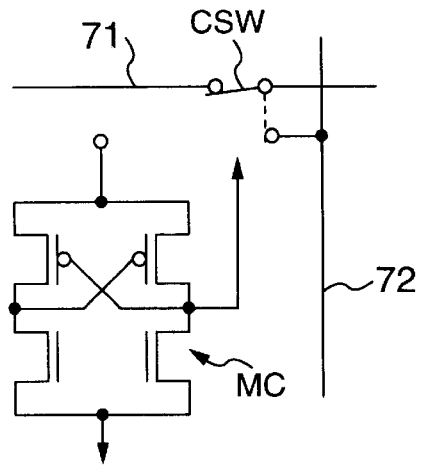

On the other hand, when the switching element SW1 is turned off and the switching element SW2 is turned on, the signal lines 71 and 72 are electrically connected to each other so that a signal is transmitted from the signal line 71 to the signal line 72 or from the signal line 72 to the signal line 71. However, instead of the provision of the RAM 74, as shown in FIG. 2C, a static memory cell MC similar to an SRAM cell and a transfer switch CSW may be disposed in each of intersecting points of the signal lines 71 and 72. The switch CSW represents a combination of switching elements SW1 and SW2 shown in FIG. 2B.

Figure 3:
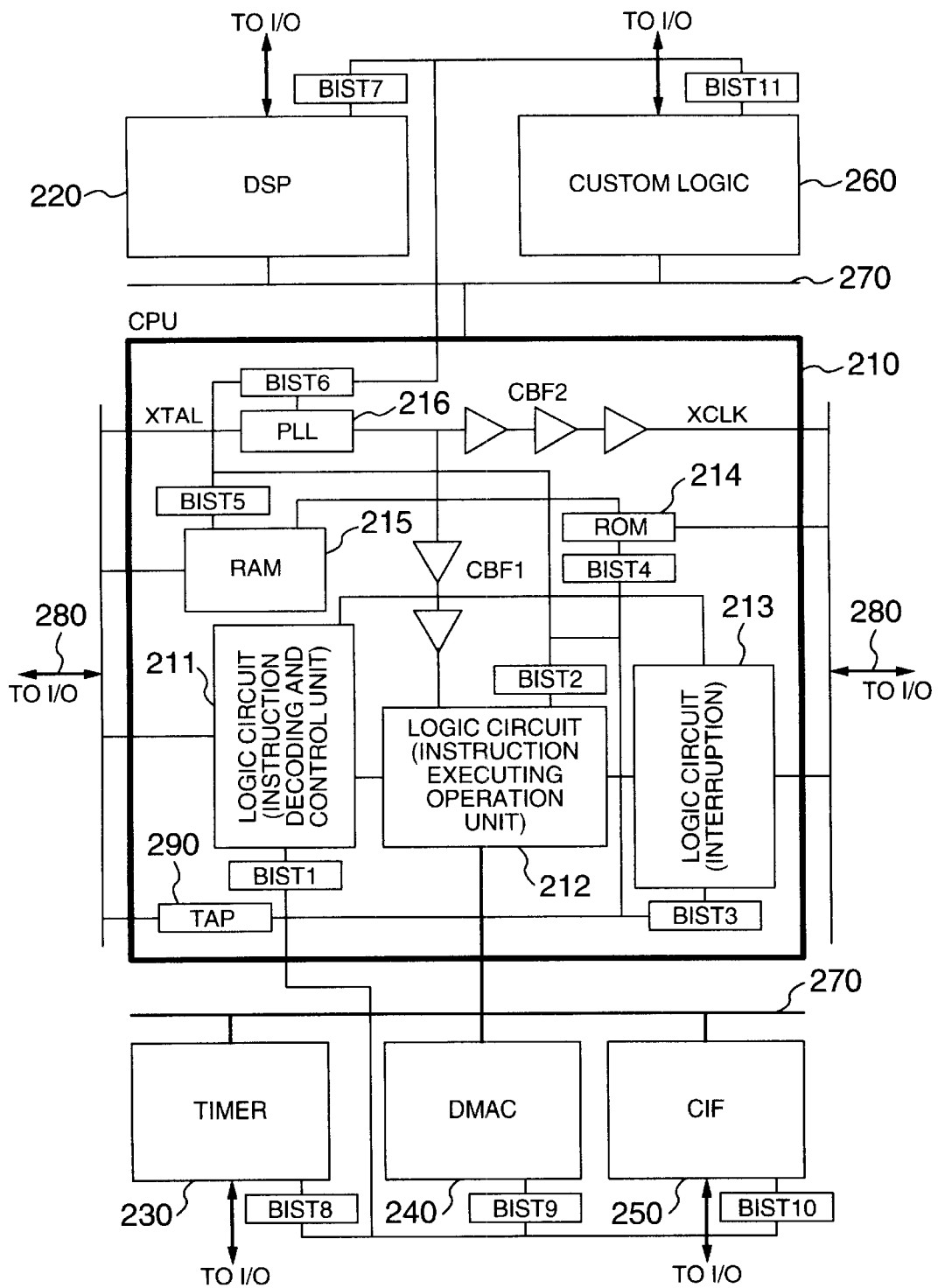
FIG. 3 is a block diagram schematically illustrating an example of an internal circuit with the exception of an input/output circuit within a microcomputer-built-in chip.

FIG. 3 schematically illustrates an example of the internal circuit ILG in the microcomputer-built-in chip 200 with the exception of the input/output circuit I/O. As shown in FIG. 3, the internal circuit ILG has a CPU portion 210, a digital signal processor (DSP) 220 for performing arithmetic operation such as sum-of-products operation and multiplication and signal processing instead of the CPU, a timer circuit 230 for performing time management required for processing of the CPU, a DMA controller (DMAC) 240 for performing data transfer of the DMA (Direct Memory Access) method between a storage unit such as an external hard-disk apparatus and an internal RAM instead of the CPU, an interface (CIF) 250 for communication between an external apparatus and the internal circuit, and a custom logic unit 260 for providing function inherent to products such as user logics. The peripheral circuits 220 to 260 are connected to the CPU 210 through an internal bus 270 so that transmission and reception of data can be performed between the peripheral circuits and the CPU through the internal bus 270.

The CPU portion 210 has a first logic circuit 211 functioning as an instruction decoding and control unit for decoding instructions of a peripheral circuit program and producing internal control signals, a second logic circuit 212 functioning as an operation unit for executing instructions, a third logic circuit 213 for performing control such as interruption to the control unit (211), a ROM (Read Only Memory) 214 for storing programs executed by the control unit (211) and fixed data required for control, a RAM (Random Access Memory) 215 for providing operation areas of the CPU and temporarily storing data produced in the course of execution of programs, and a PLL (Phase Locked Loop) 216 for generating a clock signal φ0 required for operation and control of synchronization of circuits constituting the CPU. The CPU portion 210 is connected through an external bus 280 to the input/output circuit I/O not shown and the DSP 220, the timer circuit 230, the communication interface (CIF) 250 and the custom logic unit 260 constituting the peripheral circuits except the DMAC 240 are connected to the internal bus 270 and also directly connected to the input/output circuit I/O.

In addition, the internal circuit of the microcomputer-built-in chip of the embodiment includes self-testing circuits BIST1 to BIST11 provided correspondingly to each of the logic circuits 211 to 213, the ROM 214, the RAM 215 and the PLL 216 and the peripheral circuits 220 to 260 so as to test the respective corresponding circuits locally. Since self-testing circuits such as a memory BIST and a logic BIST have been heretofore developed in accordance with functions of circuits, such resources can be utilized so that self-testing circuits optimum to each circuit block can be provided in the CPU.

Further, although not limited particularly, as interface circuits for performing input/output operation of signals between the self-testing circuits BIST1 to BIST11 and an external testing apparatus, a TAP (Test Access Port) 290 prescribed in accordance with the IEEE 1149.1 regulation is provided in the CPU and is connected to the self-testing circuits BIST1 to BIST11 through a dedicated bus (TAP bus) provided separately from the buses 270 and 280. Since the tester connected through the TAP is not required to be a high-function tester such as a conventional tester for logic LSIs and memories and may be a tester capable of performing writing and reading of data and simple data processing, a personal computer can be utilized to operate the BIST.

Moreover, although not shown, a bus state controller may be provided between the internal bus 270 and the external bus 280 so as to adjust the timing of signals on the two buses and mediate signals between the CPU and the peripheral circuits. Further, when the ROM 214 is constituted by an electrically data-writable non-volatile memory such as a flash memory capable of collectively erasing data in a predetermined block unit, a write control circuit such as a flash controller for controlling writing of data to the ROM 214 is provided.

Furthermore, the PLL circuit 216 is supplied with an oscillation signal XTAL having a predetermined frequency generated by a crystal oscillator through an external terminal and generates an internal clock φ0 obtained by multiplying or dividing the frequency of the oscillation signal XTAL. The clock signal φ0 is supplied to each portion of the CPU portion 210 through a gradually branched clock buffer tree CBF1. In addition, the clock signal generated by the PLL circuit 216 is outputted through a clock buffer line CBF2 to the outside of the chip as a clock signal XCLK so as to make synchronization with other LSIs of the system in which the chip is provided.

In the first embodiment of the testing method of the microcomputer-built-in chip according to the present invention, after the internal circuit has been tested by means of the self-testing circuits BIST1 to BIST11 provided within the chip, the input/output circuit I/O which cannot be tested by the self-testing circuits is tested by writing a testing program into a memory of any chip on the wafer and executing the testing program by means of the CPU in the chip to perform transmission and reception of signals between the chip and other chips so that whether both the input/output circuits I/O are operated normally or not is judged.

As described in the above embodiment, when the ROM 214 in the CPU portion 210 is constituted by an electrically data-writable non-volatile memory such as a flash memory, the testing program is written in the ROM 214. At this time, the program of the OS (Operating System) for guaranteeing the basic operation of the CPU may be also written in the ROM. Further, when the ROM 214 is constituted by a non-rewritable or electrically unerasable non-volatile memory such as a mask ROM, the testing program is written in the RAM 215 to be executed. At this time, the OS for guaranteeing the basic operation of the CPU is stored in the mask ROM and the testing operation can be performed by cooperation of the OS and the testing program written in the RAM.

Figure 4:
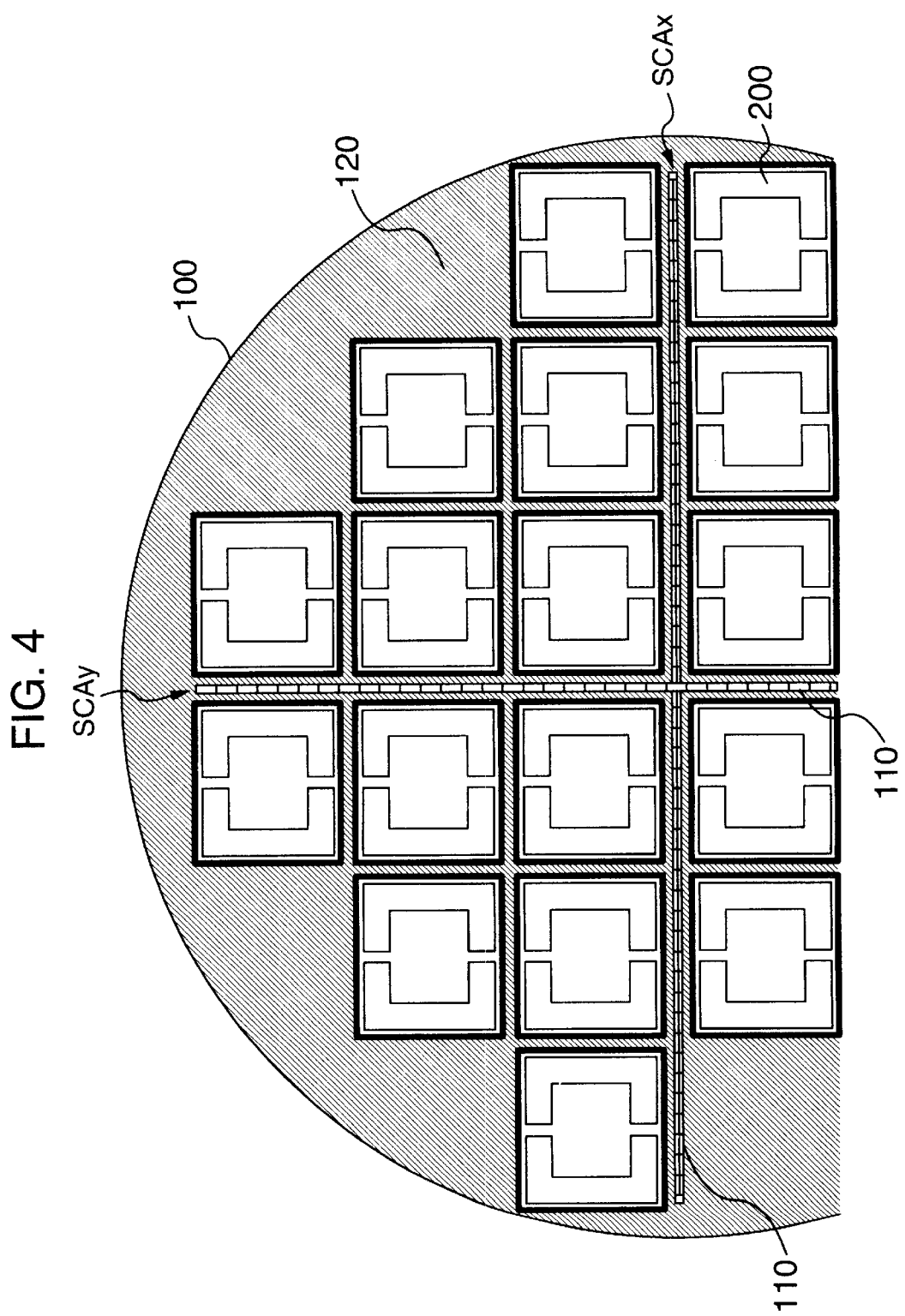
FIG. 4 is a plan view showing a structure of the whole of a wafer in an embodiment of a wafer level to which the present invention is applied.

FIG. 4 schematically illustrates an example of a structure for connection with an external testing apparatus in the semiconductor wafer to which the embodiment of the present invention is applied. As illustrated in FIG. 4, a plurality of microcomputer-built-in chips 200 are arranged on the single semiconductor wafer 100, and the wiring groups VL1 to VL5 and HL1 to HL5 and the switch array circuits 310 to 330 for making it possible to connect between any chips as shown in FIG. 1 are disposed in the chip dividing area SCA between the chips. In FIG. 4, although 18 microcomputer-built-in chips 200 are disposed on a half of the wafer for convenience of the drawing, thousands or tens of thousands of chips are sometimes disposed on a practical wafer.

Further, in the embodiment, although not limited particularly, disposed in chip dividing areas SCAx and SCAy passing through the substantially middle area of the wafer 100 are pad lines 110 connected to the wiring groups VL1 to VL5 and HL1 to HL5 disposed in other chip dividing areas. A probe provided at the leading end of a cable extended from the testing apparatus can be brought into contact with the pads to thereby perform writing to the control information RAM 74 of the switch array circuits 310 to 330 and input/output of signals to the chip 200.

Consequently, it is not necessary to provide any pad for each chip used to perform input/output of test signals, so that the number of pads for each chip can be reduced and a chip size can be made small. Further, since the test can be performed in the state of wafer, each chip can be tested in the burn-in process and the test for LSI containing an acceleration test and the test time thereof can be shortened greatly. Moreover, when pads for test are provided for each chip and test is to be performed in the state of wafer, the total number of pads is increased enormously, so that it is difficult to bring the probes from the tester into contact with all of the testing pads, although as in the embodiment the test signals are supplied from the common pads disposed in the chip dividing area to each pad, so that the number of testing pads in the whole wafer can be reduced greatly to thereby facilitate test in the state of wafer.

As apparent from reference to FIG. 4, since there is space 120 in a peripheral portion of the wafer where any chip is not formed, the RAM 74 for storing control information for the switch arrays 310 to 330 may be disposed in this space in the concentrated manner. In this case, as signal lines disposed from the control information RAM 74 to the corresponding switch arrays, signal lines disposed above the chip through an insulating layer named PIQ (polyimide insulating layer), for example, formed over the whole wafer by means of a very inexpensive process with a relatively low reliability can be used to thereby suppress a cost increased due to addition of a wiring layer.

Figure 5:
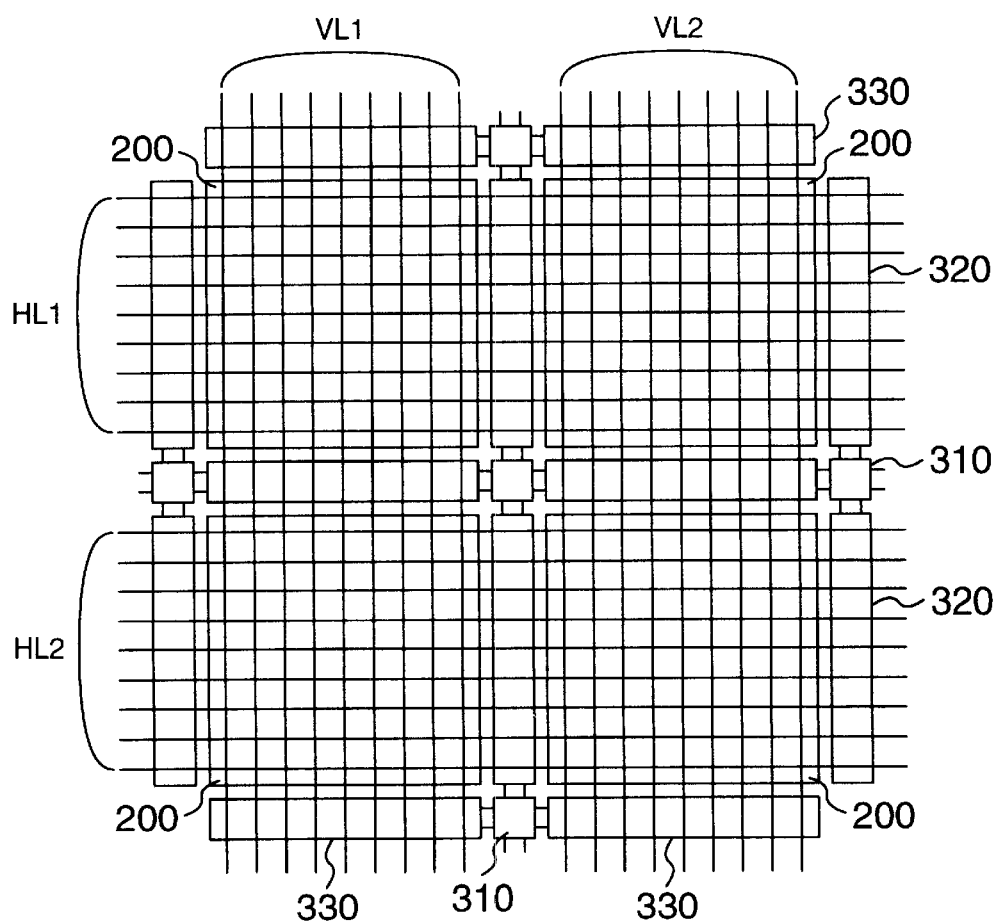
FIG. 5 is a partial plan view showing another embodiment of a wafer level to which the present invention is applied.

Further, by utilizing the PIQ, the vertical wiring groups VL1 to VL5 and the horizontal wiring groups HL1 to HL5 disposed in the chip dividing area in the embodiment shown in FIG. 1 may be formed above the area where the microcomputer-built-in chips 200 are formed as shown in FIG. 5. Consequently, even when the number of wiring conductors for connection between the chips is increased, wiring conductors can be formed without increase of the chip dividing area.

Figure 6:
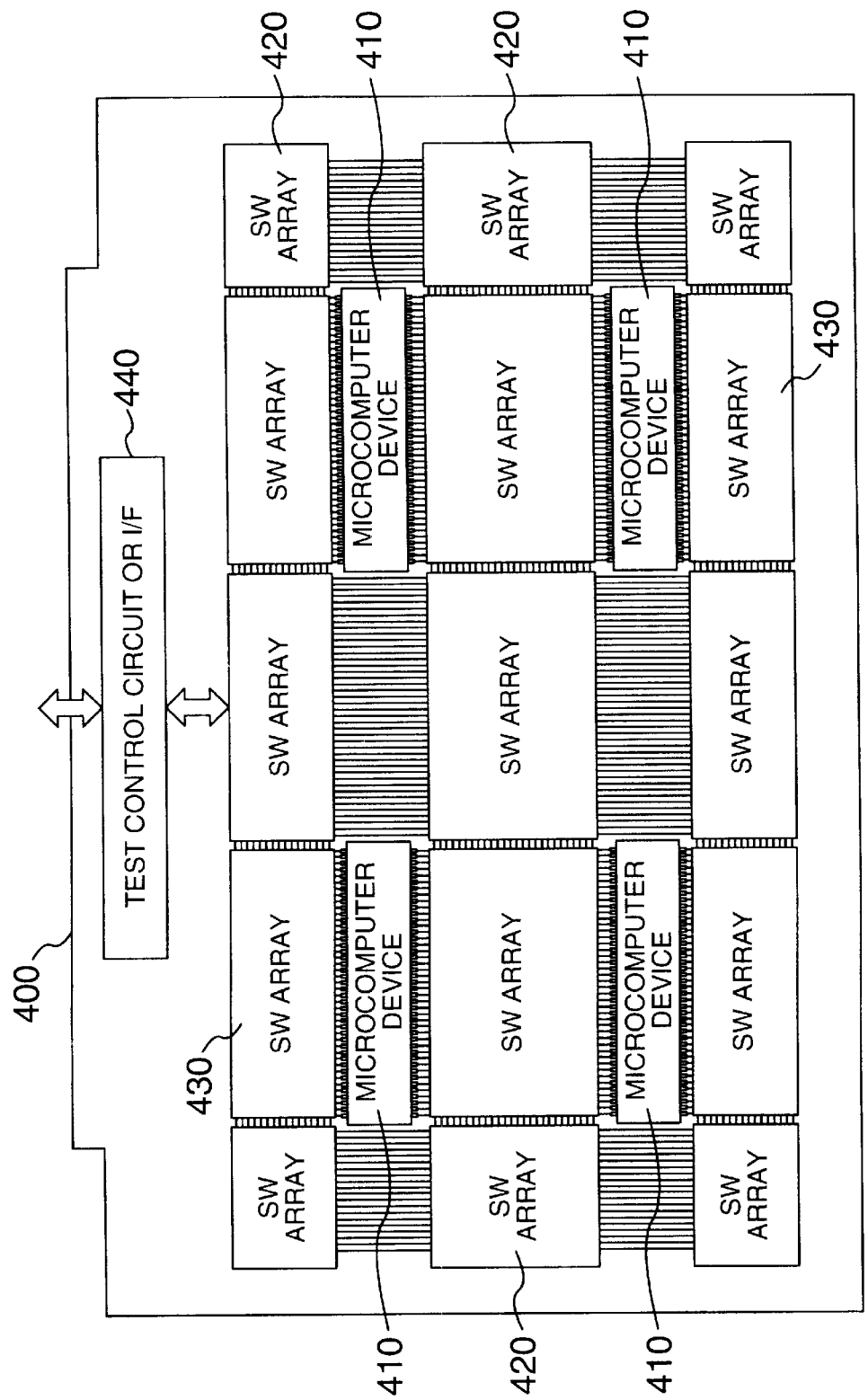
FIG. 6 is a schematic diagram illustrating an embodiment of a board level to which a test facilitating design technique according to the present invention is applied.

FIG. 6 schematically illustrates a testing board for testing a plurality of microcomputer-built-in devices packed in a package by the testing apparatus simultaneously and to which a test facilitating design technique according to the present invention is applied.

In FIG. 6, numeral 400 denotes a testing board formed of a printed wiring board, 410 sockets to which the microcomputer-built-in device to be tested are inserted, and 420 and 430 switch array devices which are semiconductor integrated circuits constituting the switch arrays as shown in FIG. 2A.

As shown in FIG. 6, the plurality of sockets 410 to which the microcomputer-built-in devices to be tested are inserted are arranged in the testing board 400 of the embodiment in the vertical and horizontal directions and the wiring groups VL1 to VL5 and HL1 to HL5 are formed in the vertical and horizontal directions in lattice-like areas separating the sockets 410 from each other on the surface of the testing board, respectively. Further, the switch array devices 420 are disposed in the intersecting portions of the vertical wiring groups VL1 to VL5 and the horizontal wiring groups HL1 to HL5 so that signal lines intersecting each other can be connected selectively and the switch array devices 430 are disposed on the way of the horizontal wiring groups HL1 to HL5 so that any signal lines of the wiring groups HL1 to HL5 can be connected to any signal input/output terminals of the microcomputer-built-in devices inserted into the sockets 410.

Further, in the embodiment, a test control circuit 440 constituted by a semiconductor integrated circuit is disposed in the center near one side of the board 400 and is connected to the switch array devices 420 through printed wiring conductors formed on the testing board 400. In FIG. 6, the sockets 410 are arranged in 2-column×4-row by way of example for convenience of the drawing, although the sockets are mounted on the actual testing board in a unit of several tens or several hundreds to be tested. A simple input/output interface circuit may be provided instead of the test control circuit 440.

Moreover, although not shown, connection terminal lines are formed in one side (upper side in the drawing) of the testing board 400 and inserted into a connector (slot) provided in a testing apparatus not shown so that transmission and reception of signals between a control apparatus on the side of the testing apparatus such as a burn-in apparatus and the test control circuit 440 on the board can be made through an interface circuit. In addition, a device protection circuit constituted by resistors, capacitors, fuses and the like may be disposed near the connection terminal lines of the testing board 400 to protect the devices to be tested from a surge voltage.

Figure 7:
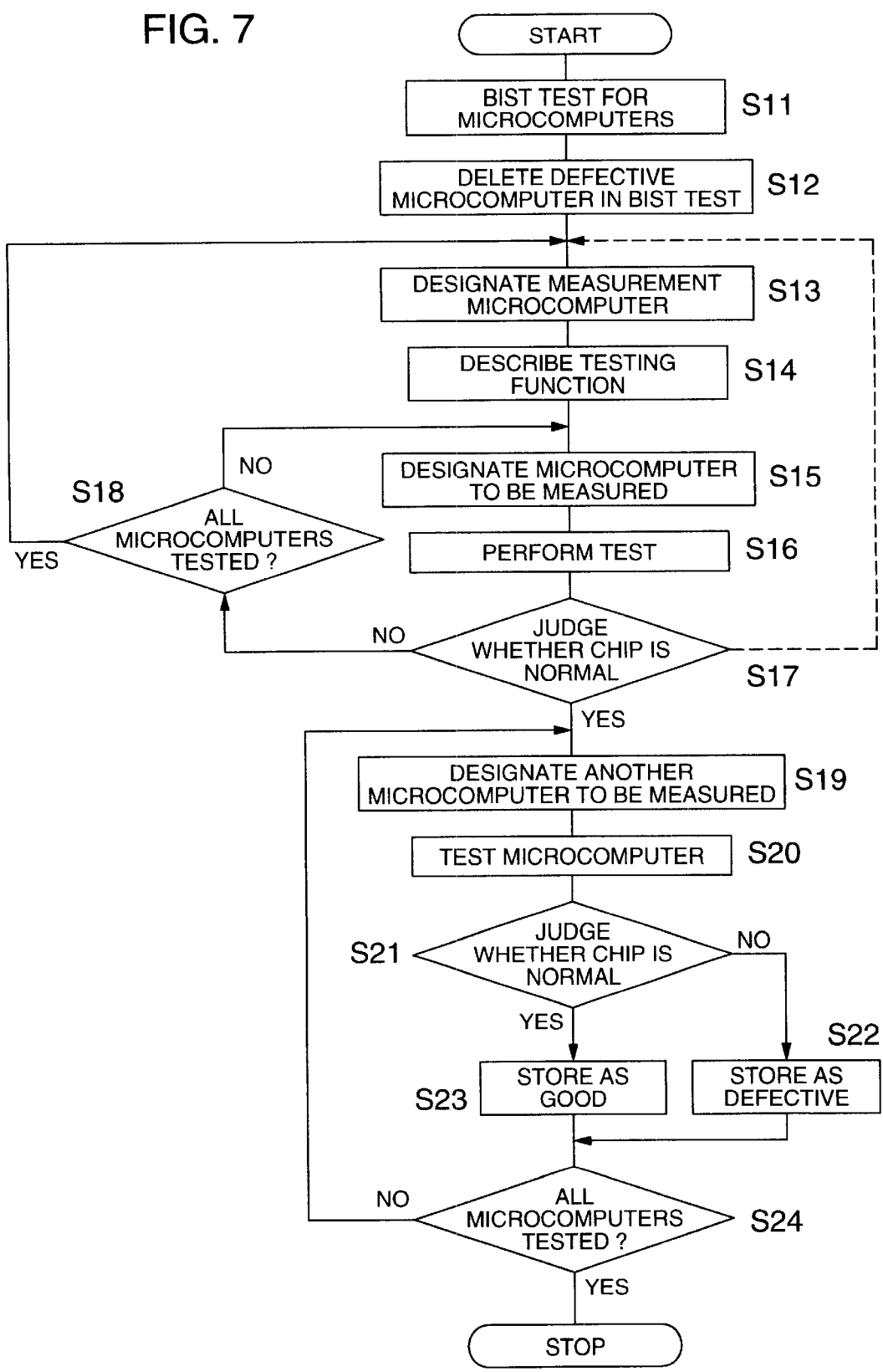
FIG. 7 is a flow chart showing an example of a test procedure between microcomputer-built-in chips or devices in the present invention.

Referring now to a flow chart shown in FIG. 7, a procedure of testing the microcomputer-built-in chips on the wafer to which the embodiment is applied is described.

In the test of the embodiment, first of all, the self-testing circuits BIST1 to BIST11 provided within the chips 200 are operated simultaneously or in order to test the internal circuit (step S11). A chip having a defective internal circuit is registered in the external testing circuit and is deleted from a list of chips to be tested.

Next, a measurement chip is designated (step S13). More particularly, probes of a simple tester are brought into contact with the pads 110 on the wafer so that wiring connection information for making it possible to store the testing program in the chip to be targeted is written in the control information RAM 74 of the switch arrays 310 to 330 provided on the wafer 100. The testing program is then stored in the chip designated in step S13 by means of the simple tester (step S14). In recent years, a technique named a virtual tester for verifying operation of the microcomputer-built-in chip by means of a simulation on a computer using a descriptive sentence described by a computer decodable language is applied to the test of the microcomputer-built-in chip. In the virtual tester, a tester language is sometimes converted into a C-language to verify the design data and the testing program at the same time. In this case, the testing function described by the C-language can be written in the memory (ROM 214 or RAM 215) in the chip 200 as it is to thereby omit a process of preparing a dedicated testing program newly.

Next, a chip to be measured is designated (step S15). More particularly, the wiring connection information is written in the control information RAM of the switch arrays 310 to 330 provided on the wafer 100 so that the chip designated in step S13 is connected to any chip to be tested by means of the simple tester. Subsequently, the testing program stored in the measurement chip is executed to start the test (step 516)

Then, the external simple tester judges on the basis of the result of the test whether the chip to be measured is normal or not (step S17). When it is not normal, the processing moves to step S18 where it is judged whether the test for all of the chips is completed or not. When the test for all of the chips is not completed, the processing is returned to step S15 and the chip to be measured is designated again to be tested. On the other hand, when it is judged in step S18 that the test for all of the chips is completed, the processing is returned to step S13 and the measurement chip is designated again. The testing program is stored in the other measurement chip to test another chip in the same manner.

In the above processing procedure, when the measurement chip first designated in step S13 is defective, the test result of other chips tested thereby are all failure and the test time is wasted in vain. Accordingly, when it is judged that the chip to be measured is not normal in step S17, the processing may be returned to step S13 as shown by broken line in FIG. 7 and a measurement chip may be designated again to store the testing program in the re-designated measurement chip and test another chip similarly. A time required to test another chip by means of the measurement chip on the wafer is compared with a time required to designate any chip by the simple tester and store the testing program therein and any one of the above designation methods may be adopted so that the total time is shortened.

In step S17, when it is judged that the chip to be measured is normal, the processing proceeds to step S19 where another chip to be measured is selected and tested by means of the measurement chip (step S20).

Thereafter, the external simple tester judges on the basis of the test result whether the chip to be measured is normal or not (step S21). When it is not normal, the processing moves to step S22 where it is stored that the chip is defective and when it is normal, the processing moves to step S23 where it is stored that the chip is good. Then, in step S24, it is judged whether test for all of the chips on the wafer is completed. When test for all of the chips is not yet completed, the processing is returned to step S19 and a chip to be measured is re-designated to perform the test. On the other hand, when it is judged that test for all of the chips on the wafer is completed in step S24, the test of the wafer is ended.

In the procedure of FIG. 7 as described above, the test that the chip designated as the measurement chip is set as the chip to be measured is not performed, while the purpose of the test performed in the embodiment is to test whether the input/output circuit of the microcomputer-built-in chip is operated normally or not. Accordingly, the fact that other chips are normal as a result of the test using the measurement chip is no more than that the input/output circuit of the measurement chip itself is also normal. Hence, it is not necessary to perform the test that the chip designated as the measurement chip is set as the chip to be measured. Further, when several hundreds or more chips are provided on a single wafer, the chips on the wafer is divided into a plurality of groups and one measurement chip is designated in each group. The testing programs are stored in a plurality of chips and started in parallel to perform test, so that a time required for test can be made short.

The procedure of testing the microcomputer-built-in chip using the testing board is substantially the same as the test in the wafer and accordingly description thereof is omitted. In the embodiment using the testing board, the devices previously judged as good in the test using the tester or the devices once judged as good in the above procedure are inserted into the sockets in place and designated as the measurement device to perform the test for other devices, so that more efficient test can be performed. Furthermore, in this case, when the memory for storing the testing program is non-volatile, writing of the testing program in step S14 can be also omitted.

Referring now to FIG. 8, a procedure of a manufacturing method of the microcomputer-built-in device to which the embodiment of FIG. 1 is applied is described. In accordance with the present invention, first, the logical function of a semiconductor integrated circuit to be developed is designed (step S101). This design of the logical function is generally made using the HDL (Hardware Description Language). With respect to description of the HDL, a support tool (program) for automatically preparing an HDL descriptive sentence from a state transition diagram or a flow chart is provided from an EDA vendor and accordingly the support tool can be utilized to make the logical design efficiently. The design data described in the HDL is subjected to a virtual test for verifying whether operation is appropriate or not by means of a verification program for generating a test pattern named a test vector. When any defect is found in the virtual test, the HDL descriptive sentence is corrected.

Next, the circuit design of a logical gate level is made in accordance with the data designed in step S101 (step S102). More particularly, cells such as logical gates and flip-flops constituting a circuit having desired function are designed. Logical combination is made in accordance with the design data and design data describing connection information among the logical gates and the cells in a network list format is prepared (step S103). In this connection, a program named a logical combination tool that the design data described in the HDL is converted into the design data of the logical gate level to be combined is provided by an EDA vendor and accordingly the program can be utilized to prepare the design data describing the connection information. Further, the design data of the logical gate level prepared is verified by means of the test vector (virtual tester ) again. When any defect is found by the virtual tester, the design data of the logical gate level is corrected.

On the other hand, in parallel to the function design (step S101), the circuit design (step S102) and the logical combination of the semiconductor integrated circuit device, the data (tester IP) used in the virtual test performed in steps S101 and S102 is utilized to make the function design of the self-testing circuit (BIST) for testing the internal circuit of the semiconductor integrated circuit device being developed (step S104). Similarly to the above, the design data relative to the BIST is converted into the design data of the gate level by making the logical combination by means of the logical combination tool.

Thereafter, layout data of element level is prepared by means of an automatic layout tool on the basis of the design data of the logic gate level of the chip-original function circuit and the BIST circuit described in the network list format obtained by the logical combination (step S106). Such an automatic layout tool is also provided by a plurality of EDA vendors. Then, simulation taking an actual load into consideration is performed on the basis of the layout data to examine whether the circuits satisfy the requirement (step S107).

Next, layout of chips on the wafer is decided (step S108). At this time, the layout data of element level concerning the switch arrays designed separately is used to arrange the switch arrays in the chip dividing area between the chips. Then, mask pattern data is prepared by an art work on the basis of the decided layout data and a mask is formed on the basis of the data (step S109). At this time, the mask for wiring pattern is designed to contain a pattern of wiring conductors for connection between the chips and formed in the chip dividing area.

Thereafter, diffusion processing and processing such as wiring pattern formation are performed on the wafer by a preceding process to form the semiconductor integrated circuit (step S110). Then, probes at the leading ends of cables extending from the test apparatus such as the wafer burn-in apparatus are brought into contact with electrode pads of the chips on the wafer so that the probe test for performing test using the BIST circuit, designation of the measurement chip, storing of the testing program, designation of the chip to be measured and the input/output test of signals between chips in accordance with the procedure of FIG. 7 is performed in parallel to the burn-in test or successively (step S111). After the probe test is completed, dicing for dividing the wafer into chips is performed (step S112).

The divided chips are packed into a package by means of sealing material such as resin (step S113). At this time, the chip judged as defective in the probe test in step S18 is previously removed. After packaged, simple selection is made to be assembled and a defective product is removed (step S114). The semiconductor integrated circuit devices packed into the package are loaded into the sockets on the testing board as shown in FIG. 6 and is placed under a high temperature by the burn-in apparatus to be tested in the packaged state again (step S115). The contents of the test at this time are substantially the same as those of the probe test performed in step S111. The package judged as defective in this test is marked on the surface of the package and removed in the selection process. Furthermore, thereafter, a characteristic test (step S116) designated mainly by a customer is performed and only the products having desired characteristics is selected as good to be shipped (step S117).

When the present invention is not applied, the test in step S114 must use a high-function tester, although application of the present invention can make test by a simple testing apparatus as compared with the tester named the burn-in apparatus or the aging apparatus.

The present invention made by the inventors has been described concretely on the basis of the embodiments, while the present invention is not limited to the embodiments and it is needless to say that various changes can be made thereto without departing from the gist thereof. For example, in the embodiments, the digital signal processor, the timer circuit, the DMA controller, the communication interface circuit and the custom logic circuit (user logic) are provided as the peripheral circuits of the CPU, while the peripheral circuits are not limited thereto and an analog circuit such as a DA conversion circuit and an AD conversion circuit may be provided. Particularly, when both of them are included, a test can be made in which an analog signal is produced from a DA conversion circuit of the chip to be tested and the analog signal is converted into a digital signal by an AD conversion circuit of the testing chip to be measured.

Further, in the embodiment, 11 pieces of BISTs constituting self-testing circuits are provided in accordance with the number of circuit blocks within the chip, while the number of BISTs is not limited thereto and when the circuit scale of the internal circuit is not so large, the self-testing circuit may be configured by one BIST. In addition, in the embodiment, a pair of chips or devices have been tested by both of the test on the wafer and the test on the board, only one of the tests can be made.

In the foregoing description, the invention made by the Inventors is applied to the microcomputer-built-in device belonging to the utilization field of the background of the invention, while the present invention is not limited thereto and can be widely utilized in the semiconductor integrated circuit including the input/output circuit and relatively difficult to test.

Furthermore, according to the present invention, the testing program can be written in any of chips or devices in the microcomputer-built-in LSI to test other chips or devices so that judgment as to whether the chips or devices are good or defective can be made efficiently and the test can be made without using a expensive tester to thereby reduce the cost required for the test.

Moreover, since the circuit and the wiring conductors required when the test is performed can be formed in the chip dividing area on the wafer, there can be realized the test facilitating technique without the overhead of hardware due to provision of the testing function.

In addition, in the present invention, since the C-language is used to configure the testing function in the microcomputer-built-in chip, introduction of the testing function into the chip can be made easily by means of a computer. The testing program used in the virtual test can be used and debugging for the testing function is not required, so that time and labor for design of the test can be reduced greatly.

What is claimed is:

1. A method of manufacturing a semiconductor integrated circuit device including a microprocessor or microcomputer and a writable memory circuit for storing an operation program of the microprocessor or microcomputer, comprising the steps of:

providing wiring conductors for connecting between chips and providing variable switch circuits for connecting between predetermined wiring conductors on a wafer which forms a plurality of microprocessor-built-in chips or microcomputer-built-in chips;

writing a testing program including transmission and reception operation of signals between said chips into a writable memory circuit usable as a program storage area in one of said chips; and executing said testing program by said microprocessor or microcomputer of said one of said chips to thereby test itself and another chip.

2. A manufacturing method of a semiconductor integrated circuit device according to claim 1, wherein said test of another chip by said one of said chips having said testing program is to test an input/output circuit by transmission and reception of signals between said chips.

3. A manufacturing method of a semiconductor integrated circuit device according to claim 2, further comprising the steps of:

providing a self-testing circuit for testing an internal circuit within said microprocessor built-in chip or microcomputer built-in chip;

testing said internal circuit by said self-testing circuit; and testing said input/output circuit by means of transmission and reception of signals between said chips.

4. A manufacturing method of a semiconductor integrated circuit device according to claim 3, further comprising the steps of:

dividing said internal circuit into a plurality of functional blocks;

providing said self-testing circuit in each of said functional blocks;

testing said functional block corresponding to said self-testing circuit; and testing said input/output circuit by means of the transmission and reception of the signals between said chips.

5. A manufacturing method of a semiconductor integrated circuit device according to claim 1, wherein said wiring conductors for connecting between said chips and said variable switching circuits for connecting between said predetermined wiring conductors are disposed in a chip-dividing area of said wafer.

6. A manufacturing method of a semiconductor integrated circuit device according to claim 1, wherein said wiring conductors for connecting between said chips are disposed in a whole area of said wafer and said variable switching circuits for connecting between said predetermined wiring conductors are disposed in a chip-dividing area of said wafer.

7. A manufacturing method of a semiconductor integrated circuit device according to claim 4, wherein said test of said internal circuit or said functional block by said self-testing circuit and said test of said input/output circuit by means of the transmission and reception of signals between said chips are performed by a burn-in apparatus or an aging apparatus in a state where the chips are mounted on said wafer.

8. A manufacturing method of a semiconductor integrated circuit device according to claim 1, wherein said testing program written in said memory circuit within said chip is specified by a C-language used in a virtual tester.

9. A method of manufacturing a semiconductor integrated circuit device including a microprocessor or microcomputer and a writable memory circuit for storing an operation program of the microprocessor or microcomputer, comprising the steps of:

attaching microprocessor-built-in devices or microcomputer-built-in devices into a plurality of sockets of a testing board provided with said plurality of sockets for connecting with said microprocessor-built-in devices or microcomputer-built-in devices enclosed in a package and variable switching circuits for connecting between said sockets and connecting between predetermined wiring conductors;

writing a testing program for another device into a writable memory circuit for being used as a program storage area in one of said devices; and executing said testing program by said microprocessor or microcomputer of said one of said devices to thereby test itself and another device.

10. A manufacturing method of a semiconductor integrated circuit device according to claim 9, wherein said test of another device by said one of said devices having said testing program written therein is to test an input/output circuit by transmission and reception of signals between the devices.

11. A manufacturing method of a semiconductor integrated circuit device according to claim 9, further comprising the steps of:

providing a self-testing circuit for testing an internal circuit within said microprocessor-built-in device or microcomputer-built-in device;

testing said internal circuit by said self-testing circuit; and testing said input/output circuit by means of transmission and reception of signals between said devices.

12. A manufacturing method of a semiconductor integrated circuit device according to claim 11, further comprising the steps of:

dividing said internal circuit into a plurality of functional blocks;

providing said self-testing circuit in each of said functional blocks;

testing said functional block corresponding to said self-testing circuit; and testing said input/output circuit by means of the transmission and reception of signals between said devices.

13. A manufacturing method of a semiconductor integrated circuit device according to claim 12, wherein said test of said internal circuit or said functional block by said self-testing circuit and said test of said input/output circuit by means of the transmission and reception of signals between said devices are performed by a burn-in apparatus or an aging apparatus in a state where the devices are mounted on a wafer.

14. A manufacturing method of a semiconductor integrated circuit device according to claim 9, wherein said wiring conductors for connecting between said devices and said variable switch circuits for connecting between said predetermined wiring conductors are formed of a semiconductor integrated circuit.

15. A manufacturing method of a semiconductor integrated circuit device according to claim 9, wherein said testing program written in said memory circuit within one of said devices is specified by a C-language used in a virtual tester.

* * * * *